(12) United States Patent
Xie et al.

(10) Patent No.: US 8,487,347 B2
(45) Date of Patent: Jul. 16, 2013

(54) ARRAY SUBSTRATE AND MANUFACTURING METHOD THEREOF

(75) Inventors: Zhenyu Xie, Beijing (CN); Xiang Liu, Beijing (CN); Xu Chen, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 169 days.

(21) Appl. No.: 12/887,698

(22) Filed: Sep. 22, 2010

(65) Prior Publication Data

US 2011/0073867 A1 Mar. 31, 2011

(30) Foreign Application Priority Data

Sep. 25, 2009 (CN) .......................... 2009 1 0093194

(51) Int. Cl.
*H01L 27/118* (2006.01)

(52) U.S. Cl.
USPC .............. 257/202; 257/72; 438/158; 438/149

(58) Field of Classification Search
USPC ........................ 257/72, E31.126, 202; 438/34
See application file for complete search history.

(56) References Cited

U.S. PATENT DOCUMENTS

| | | | | |
|---|---|---|---|---|
| 6,159,779 A | * | 12/2000 | Huang et al. | 438/158 |
| 2002/0180900 A1 | * | 12/2002 | Chae et al. | 349/43 |
| 2006/0118786 A1 | | 6/2006 | Kim et al. | |
| 2006/0157844 A1 | * | 7/2006 | Takano et al. | 257/690 |
| 2008/0062344 A1 | | 3/2008 | Yoshimoto | |
| 2008/0096015 A1 | * | 4/2008 | Yan | 428/336 |
| 2009/0020758 A1 | | 1/2009 | Lee et al. | |

FOREIGN PATENT DOCUMENTS

| | | |
|---|---|---|
| CN | 1790750 A | 6/2006 |
| CN | 101140398 A | 3/2008 |
| CN | 101349847 A | 1/2009 |
| KR | 20000002805 A | 1/2000 |
| KR | 100672623 B1 | 1/2007 |
| KR | 20080012448 A | 2/2008 |

* cited by examiner

*Primary Examiner* — Ajay K Arora

(74) *Attorney, Agent, or Firm* — Ladas & Parry LLP

(57) ABSTRACT

An array substrate comprises a substrate provided with a circuit pattern and covering layers that cover the upper surfaces and side surfaces of respective portions of the circuit pattern.

18 Claims, 9 Drawing Sheets

US 8,487,347 B2

ARRAY SUBSTRATE AND MANUFACTURING METHOD THEREOF

BACKGROUND

Embodiments of the invention relates to an array substrate and the manufacturing method thereof.

TFT-LCDs (thin film transistor liquid crystal displays) are currently a mainstream flat panel display. A liquid crystal panel comprises an array substrate and a color filter substrate that are joined together face to face. According to the requirement of different structure designs, the circuit structures such as gate scanning lines, data lines, and common electrodes can be formed respectively on the array substrate and on the color filter substrate.

For a TFT-LCD of large size and high resolution, signal delay due to line resistance has serious an adverse effect on display quality. A way to solve the problem is to adopt a material of low resistance. The resistivity of an active metal is generally much lower than that of a non-active metal; for example, the active metal copper (Cu) has a resistivity of approximately $1.7 \times 10^{-6}$ Ohm/centimeter ($\Omega$/cm), while the non-active metal molybdenum (Mo) has a resistivity of approximately $5.7 \times 10^{-6}$ $\Omega$/cm; an active metal such as copper is therefore often used as the material for forming patterns on a substrate. Notwithstanding its relatively good conductivity, copper has a number of disadvantages, for example: 1) the adhesion between copper and a glass substrate or silicon nitride is poor; 2) when in contact with silicon nitride, copper is ready to diffuse, which adversely affects the insulating characteristics of silicon nitride, and copper can react with silicon to form copper silicide; and 3) copper may contaminate equipments in the subsequent process such PECVD (Plasma-Enhanced Chemical Vapor Deposition), which adversely affects film characteristics.

At present time, it is a regular approach to form a copper wiring structure of three layers: a lower barrier layer, a copper or copper alloy intermediate layer, and an upper barrier layer. Such an approach can reduce deterioration of TFT properties due to the diffusion of copper. However, the side surfaces of the copper wiring, not protected by any protection layer, are still exposed, which still has an adverse effect on the insulating material layer of silicon nitride.

SUMMARY

An embodiment of the invention provides a base substrate, a circuit pattern provided on the base substrate; and a covering layer, covering and contacting an upper surface and side surfaces of the circuit pattern.

Another embodiment of the invention also provides a method of manufacturing an array substrate, comprising steps of: depositing a circuit pattern film on a base substrate and patterning the circuit pattern film to form a circuit pattern; and depositing a covering layer film and patterning the covering layer film to form a pattern of a covering layer, wherein the covering layer covers an upper surface and side surfaces of the circuit pattern.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Figure 1:
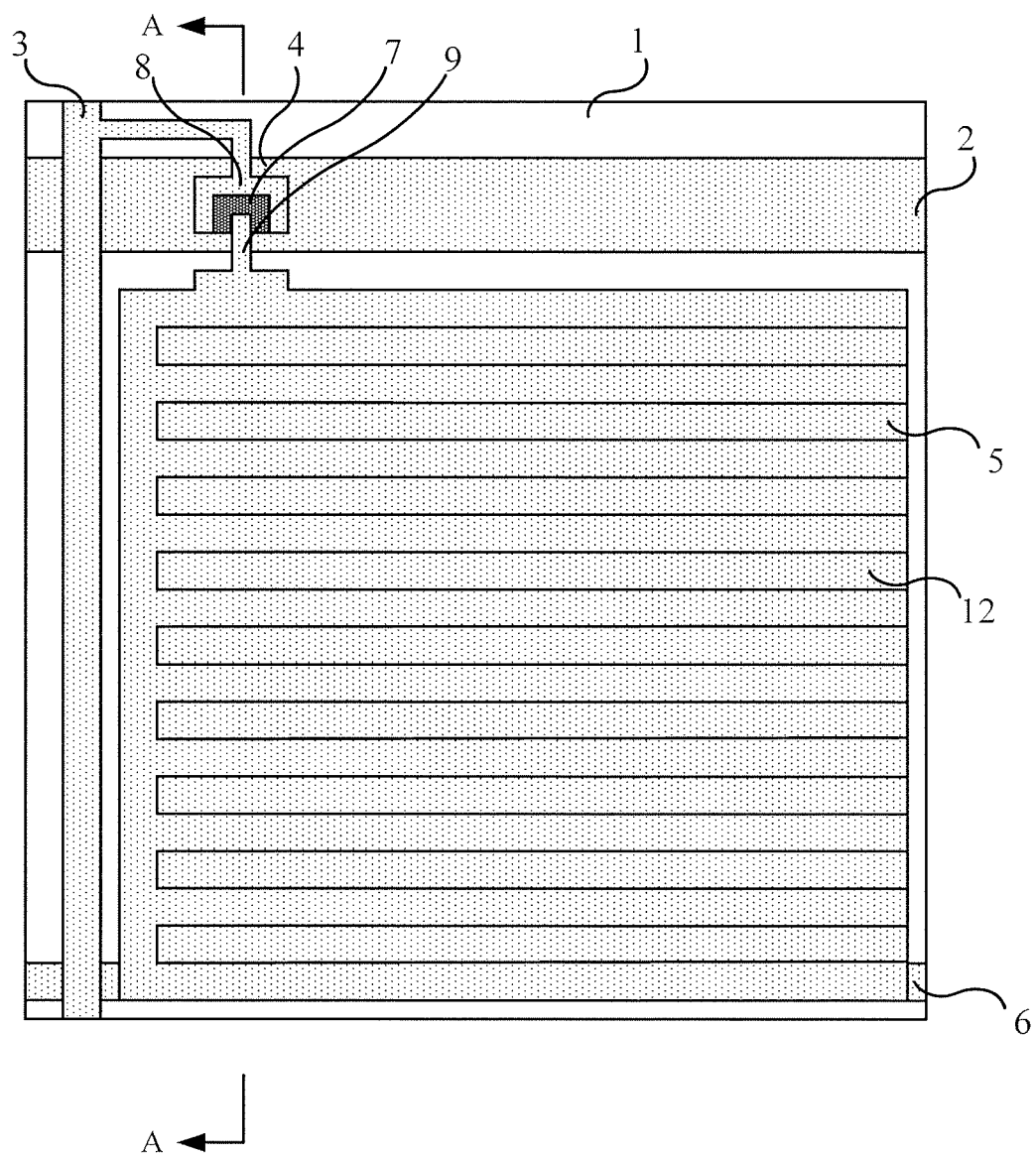
FIG. 1 is a schematic top view showing the structure of part of the array substrate provided by the first embodiment of the invention.

Hereinafter, embodiments of the invention will be described in detail with references to the accompanying drawings An embodiment of the invention provides an array substrate, which comprises a substrate provided with a circuit pattern. The circuit pattern can comprise a gate scanning line, a gate electrode, a common electrode, a data line, an active layer, a source electrode, a drain electrode, and etc. To keep different parts of the circuit pattern insulated from each other, the different parts of the circuit pattern are disposed individually or are separated from one another with an insulating layer. For example, the gate scanning line, the gate electrode, and the common electrode line can be covered by a gate insulating layer, and the data line, the active layer, the source electrode, and the drain electrode are covered by a passivation layer. The gate insulating layer and the passivation layer are often made of an insulating material such as silicon nitride. An array substrate according to the embodiment of the invention also comprises a covering layer, which covers the upper surface and the side surfaces of a part of the circuit pattern. For example, there are provided a first covering layer and a second covering layer. The first covering layer covers the upper surface and the side surfaces of the gate scanning line and the gate electrode; in addition, in the case where a common electrode line formed simultaneously with the gate scanning line with the same material is disposed on the substrate, the first covering layer can also cover the upper surface and the side surfaces of the common electrode line. The second covering layer covers the upper surface and the side surfaces of the data line, the source electrode, and the drain electrode. A thin film transistor (TFT) switch with the covering layers may have the following structure: the active layer is formed on the gate electrode; the end of the source electrode and the end of the drain electrode are disposed on the active layer, opposite to each other; the second covering layer covers the upper surface and the side surfaces of the source electrode and the drain electrode and is disconnected at the end of the source electrode and the end of the drain electrode so as to expose the TFT channel of the active layer.

In the embodiment of the invention, the conductive circuit pattern can, therefore, be made of a low resistance metal material such as copper or aluminum, which has good conductivity and yet is highly diffusible in an insulating material. This is because the upper surfaces and the side surfaces of respective parts of the circuit pattern are covered and blocked by a covering layer, which prevents the highly diffusible metal from diffusing in an insulating material and thus helps to avoid adverse effect on the characteristics of the insulating layer. Here, a low resistance material usually refers to a metal with a resistivity lower than 10 µΩ/cm.

The covering layer can be used to cover different parts of the circuit pattern on various kinds of substrates with the circuit pattern formed thereon. The circuit pattern at least comprises a primary conductive layer formed of a material such as copper or aluminum, and may further comprise a lower barrier layer and/or an upper barrier layer. The lower barrier layer and the primary conductive layer are formed, constituting a laminate structure, and the lower barrier abuts the lower surface of the primary conductive layer, which can enhance the adhesion between the primary conductive layer and the underneath substrate. The upper barrier layer and the primary conductive layer are formed, constituting a laminate structure, and the upper barrier layer abuts the upper surface of the primary conductive layer but under the covering layer, which blocks the influence of the primary conductive layer on upper layers. Although the upper barrier layer and the lower barrier layer can also function to block such influence, they are formed simultaneously with the primary conductive layer in a same patterning process, and thus their patterns completely overlaps that of the primary conductive layer and are unable to protect the side surfaces of the primary conductive layer.

According to the embodiment, by means of providing a covering layer that can extend to the side surfaces of the primary conductive layer, the covering layer can be in direct contact with the underlying substrate, which enhances the adhesion between the primary conductive layer and the substrate and thus prevent stripping of the primary conductive layer. Moreover, the pixel electrode can be directly lapped over and connected to the drain electrode, which enhances the reliability of processes.

The material of the primary conductive layer is preferably copper, aluminum, copper alloy, or aluminum alloy; the material of the covering layer is preferably indium tin oxide (ITO), indium zinc oxide (IZO), molybdenum, molybdenum-niobium alloy (MoNb), molybdenum-titanium alloy (MoTi), titanium (Ti), or titanium nitride (TiN); the material of the lower barrier layer and/or the upper barrier layer is preferably molybdenum, molybdenum-niobium alloy, molybdenum-titanium alloy, titanium, or titanium nitride.

A transparent material such as ITO and IZO is used to manufacture the covering layer. On one hand, this material can prevent copper, aluminum, and etc from diffusing into an insulating layer such as silicon nitride so as not to adversely affect the characteristics of the TFT; and on the other hand, this material makes it difficult for the circuit pattern of copper, aluminum, and etc to strip.

For example, in the case where aluminum is used to form the primary conductive layer and an oxide is used to form the covering layer, it is preferable to provide the lower barrier layer and the upper barrier layer, because aluminum is apt to be oxidized and produces insulating aluminum oxide. Aluminum formed on the side surfaces of the primary conductive layer does not affect the conductivity thereof; while the upper surface of the primary conductive layer preferably maintains its conductivity, because it is often connected to other circuit pattern in an upper level through via holes.

The embodiment of the invention uses a covering layer to cover circuit pattern, which can be widely applied to various structures of different array substrates. To simplify processes, the description takes a FFS (fringe field switching) type TFT-LCD as an example.

First Embodiment

Figure 2:
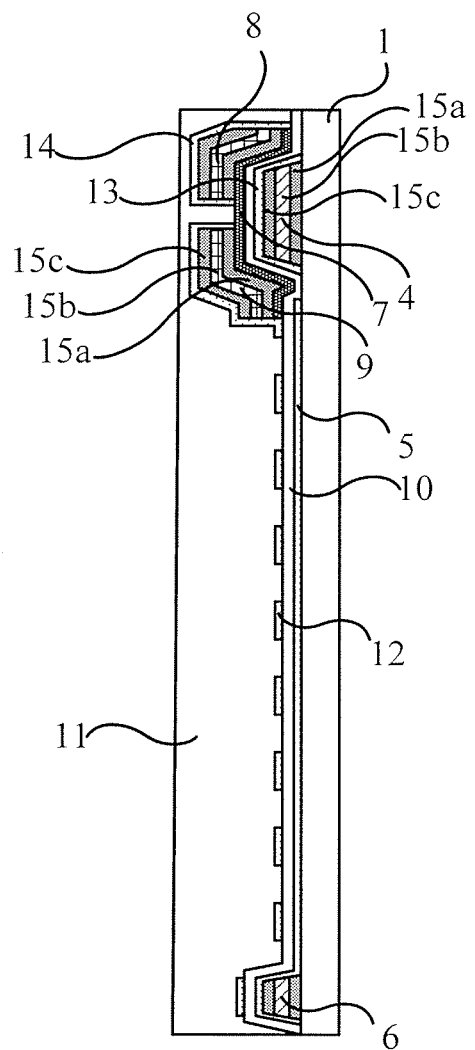
FIG. 2 is the side view of the section taken along A-A of FIG. 1.

FIG. 1 is a schematic top view, showing the structure of a part of the array substrate provided by the first embodiment of the invention, and FIG. 2 is the side view of the section taken along A-A of FIG. 1.

The circuit pattern on a base substrate 1 of the array substrate comprises a gate scanning line 2 and a data line 3, which define a pixel unit, and the pattern further comprises a TFT switch, a common electrode 5, a common electrode line 6, and a pixel electrode 12, which are formed on the pixel unit. The TFT switch comprises a gate electrode 4, an active layer 7, a source electrode 8, and a drain electrode 9. The common electrode 5 is in a block-shaped pattern that covers the pixel unit. The pixel unit 12 is a comb-shaped pattern with slits formed therein. The covering structure comprises a first covering layer 13 that covers the gate scanning line 2, the gate electrode 4, and the common electrode line 6; the cover structure also comprises a second covering layer 14 that covers the data line 3, the source electrode 8, and the drain electrode 9, as illustrated in FIG. 2. The first covering layer covers the upper surface and the side surfaces of the gate scanning line 2, gate electrode 4, and common electrode line 6; the first covering layer can be formed simultaneously with the common electrode 5 with the same material. The second covering layer 14 covers the upper surfaces and side surfaces of the data line 3, source electrode 8, and drain electrode 9; and the second covering layer can be formed simultaneously with the common electrode 12 with the same material. Of the pixel electrode material formed on the drain electrode 9, a portion serves as the second covering layer, the other serves as the connecting portion between the pixel electrode and the drain electrode 9.

Based on the above, a protection film layer 11 can be further formed on the substrate 1 with the covering layers and the pixel electrode 12 formed thereon, in order to protect the active layer 7 between the source electrode 8 and the drain electrode 9. The protection film layer 11, serving as a passivation layer for protection, does not require the patterning process of forming via holes, and can have a flat surface, which is helpful to the subsequent assembling process.

The layer structure of the gate electrode 4, the active layer 7, and the common electrode line 6 and the layer structure of the data line 3, the source electrode 8, and the drain electrode 9 can both comprise a lower barrier layer 15a, a primary conductive layer 15b, and an upper barrier layer 15c. The upper barrier layer 15c and the lower barrier layer 15a can comprise molybdenum, molybdenum-niobium alloy, molybdenum-titanium alloy, titanium, or titanium nitride, and the primary conductive layer 15b can comprise copper or copper alloy.

The first covering layer 13 and the common electrode 5 can both comprise ITO and can be formed in the same etching process; the second covering layer 14 and the pixel electrode 12 can both comprise ITO and can be formed in the same etching process. The embodiment utilizes the steps of manufacturing the patterns of the common electrode 5 and the pixel electrode 12 for an FFS type array substrate to form the first covering layer 13 and the second covering layer 14 and thus resolves the problem that the conductive material such as copper and aluminum diffuses into the gate insulating layer 10 and the protection film layer 11 and at the same time avoids separate steps of forming the covering layers. The embodiment does not add complexity to the processes and thus can be readily applied to the traditional processes.

In the embodiment, by means of providing the lower barrier layer 15a for the primary conductive layer 15b of the gate scanning line 2, the gate electrode 4, and the common electrode line 6, it is possible to enhance the adhesion between the primary conductive layer 15b and the base substrate 1, which prevents the circuit pattern from stripping; by means of providing the upper barrier layer 15c, it is possible to prevent reaction between the upper surface of the primary conductive layer 15b and the first covering layer 13. In the case where the primary conductive layer 15b preferably comprises aluminum, the structure of this embodiment is particularly applicable.

By means of providing the lower barrier layer 15a for the data line 3, the source electrode 8, and the drain electrode 9, it is possible to prevent the material of the data line 3, the source electrode 8, and the drain electrode 9 from diffusing towards the lower active layer 7; and it is also possible to enhance the adhesion between the active layer 7 and the source/drain electrode, which prevents the circuit pattern from stripping. Nevertheless, due to different processes, the data line sometimes is in direct contact with the gate insulating layer and the source/drain electrode is in direct contact with the active layer, it is possible to prevent the active metal from diffusing into the gate insulating layer and the active layer with a lower barrier layer disposed below the data line and the source/drain electrode. By means of providing the upper barrier layer 15c, it is possible to prevent the reaction between the upper surface of the primary conductive layer 15b and the second covering layer 14. Such a structure is particularly applicable in the case where the primary conductive layer 15b comprises aluminum.

Second Embodiment

Figure 3:
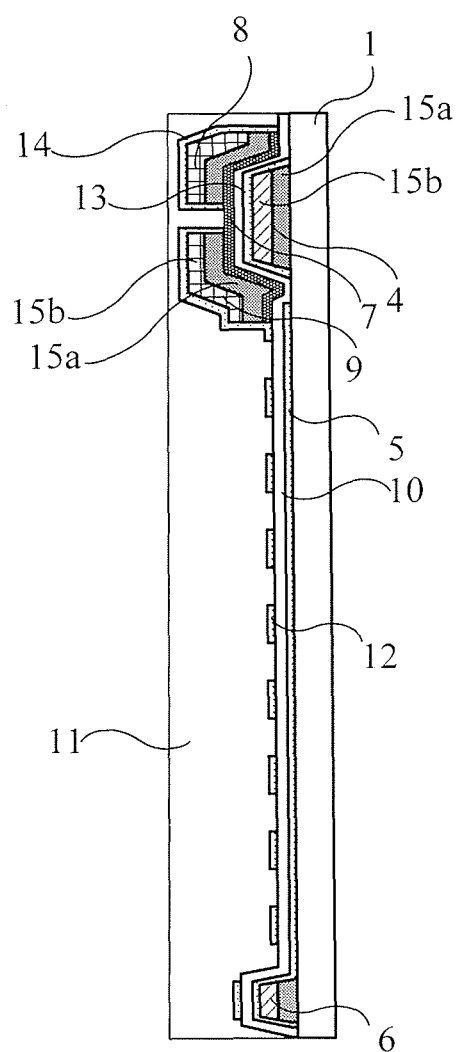
FIG. 3 is the side view of the section of the array substrate according to the second embodiment of the invention.

The top view of the structure of the array substrate according to the second embodiment of the invention is also shown in FIG. 1. FIG. 3 is the side view of the section of the array substrate according to the second embodiment of the invention. This embodiment differs from the first one in that the circuit pattern only comprises the lower barrier layer 15a and the primary conductive layer 15b. Compared with the first embodiment, this embodiment makes it possible to further economize on material usage and saves the process of depositing an upper barrier layer film.

The circuit pattern formed in the same layer, such as the gate scanning line, the gate electrode, and the common electrode line, or the data line, the source electrode, and the drain electrode, may have particular layer structures designed as necessary. For example, the gate scanning line, the gate electrode, and the common electrode line can be formed directly on the substrate without providing a lower barrier layer to prevent the material of the primary conductive layer from diffusing towards the lower insulating layer; the covering layer, covering the side surfaces of the circuit pattern, can be in direct contact with the base substrate via the extension portion of the side surfaces, which enhances the adhesion between the primary conductive layer and the substrate. The lower barrier layer and the upper barrier layer can be optically provided for the data line, the source electrode, and the drain electrode, depending on the material used therefor.

Another embodiment of the invention provides a method of manufacturing an array substrate, comprising steps of depositing a circuit pattern film on a substrate and patterning the film to form a circuit pattern; depositing a covering layer film on the substrate with the circuit pattern formed thereon and patterning the film to form a pattern of the covering layer, wherein the covering layer covers the upper surface and the side surfaces of the circuit pattern.

The method of manufacturing an array substrate can be used to manufacture an array substrate. Compared with the traditional array substrate manufacturing method, the method has an additional step of depositing a covering layer film and etching the film to form a covering layer pattern. The manufacturing method employs two patterning processes to form the circuit pattern with the covering layer: the first patterning process for forming the circuit pattern, and the second one for forming the pattern of the covering layer to cover the upper surface and the side surfaces of the circuit pattern. The mask used in the second patterning process can be wider than that used in the first patterning process corresponding to the circuit pattern, so that the circuit pattern fall within the boundary of the pattern of the covering layer and have their upper surface and the side surfaces covered by the covering layer, preventing a metal material such as copper and aluminum from diffusing into the insulating layer.

The aforementioned step of depositing a circuit pattern film before the first patterning process can be carried out in any one the following ways:

depositing, successively, a lower barrier layer film, a primary conductive layer film, and an upper layer film on the substrate as the circuit pattern film, thus the circuit pattern formed through etching comprises the overlapping lower barrier layer, primary conductive layer, and upper barrier layer; or depositing, successively, a primary conductive layer film and an upper layer film on the substrate as the circuit pattern film, thus the circuit pattern formed through etching comprises the overlapping primary conductive layer and upper barrier layer; or depositing, successively, a lower barrier layer film and a primary conductive layer film on the substrate as the circuit pattern film, thus the circuit pattern formed through etching comprises the overlapping lower barrier layer and primary conductive layer; or depositing a primary conductive layer film on the substrate as the circuit pattern film, thus the circuit pattern formed through etching only comprises the primary conductive layer.

According to different structure designs of an array substrate, the method of manufacturing an array substrate according to an embodiment can have a plurality of forms. To reduce process number and save material, it is preferably to utilize the material and processes of forming the patterns of the array substrate to form the covering layers. The material of the primary conductive layer preferably comprises copper, aluminum, copper alloy, or aluminum alloy; the material of the covering layers preferably comprises indium zinc oxide, indium tin oxide, molybdenum, molybdenum-niobium alloy, molybdenum-titanium alloy, titanium, or titanium nitride; the material of the lower barrier layer and/or the upper barrier layer preferably comprises molybdenum, molybdenum-niobium alloy, molybdenum-titanium alloy, titanium, or titanium nitride.

Description will be given below with the preferred example of an FFS type TFT-LCD.

Third Embodiment

The third embodiment of the invention provides a method of manufacturing an array substrate of an FFS type TFT-LCD. The method comprises the following steps.

Figure 4:
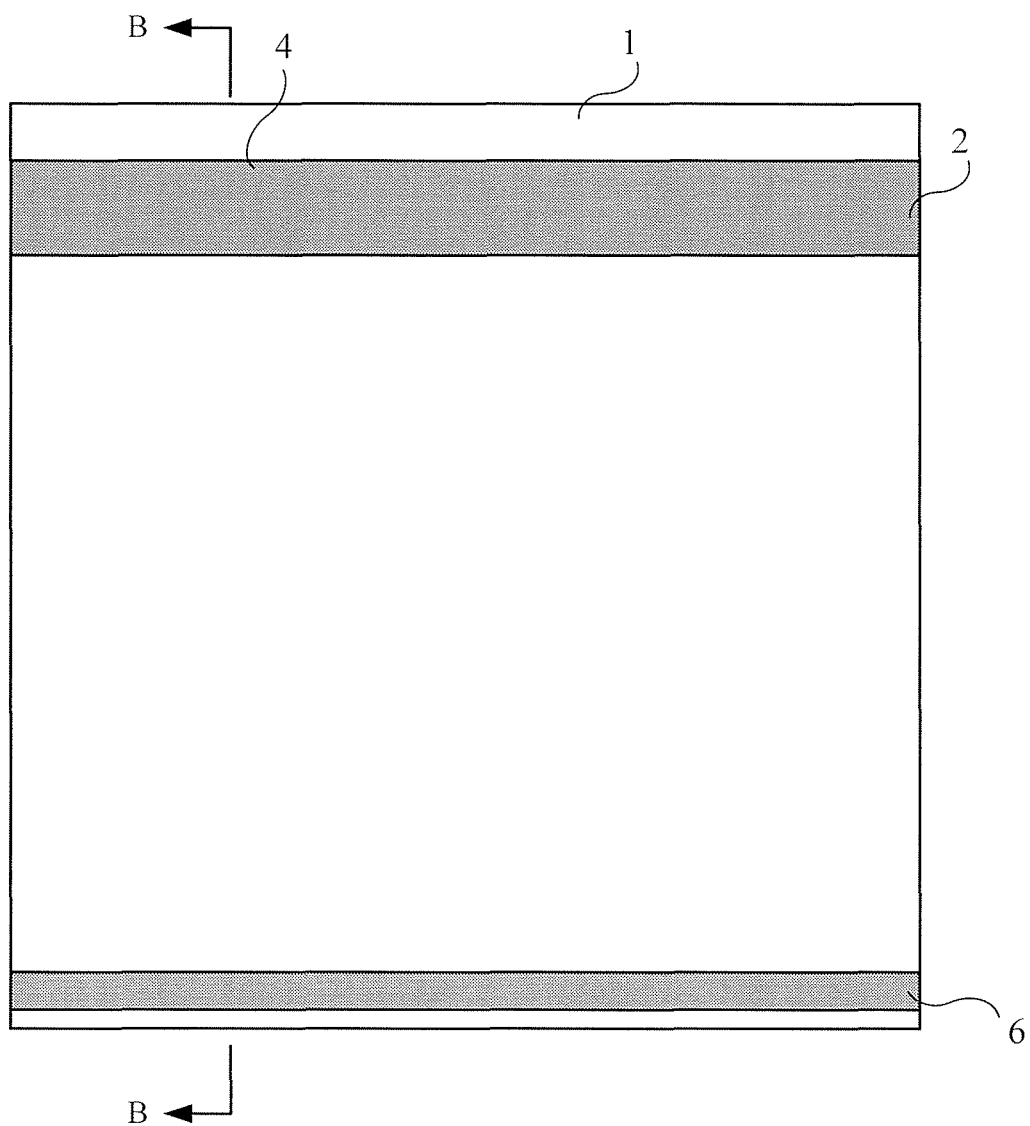
FIG. 4 is the first schematic top view showing the structure of part of the array substrate manufacture by the third embodiment of the invention.
Figure 5:
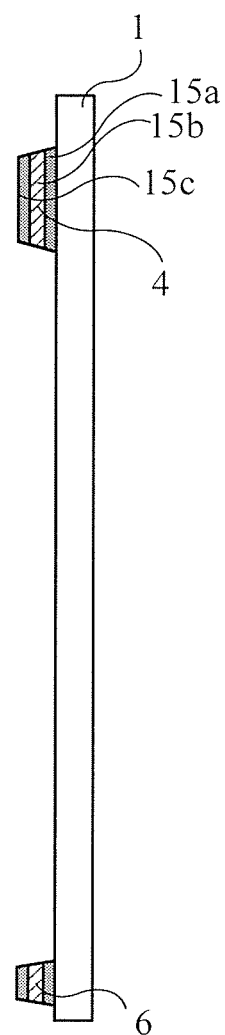
FIG. 5 is the side view of the section taken along B-B of FIG. 4.
Figure 6:
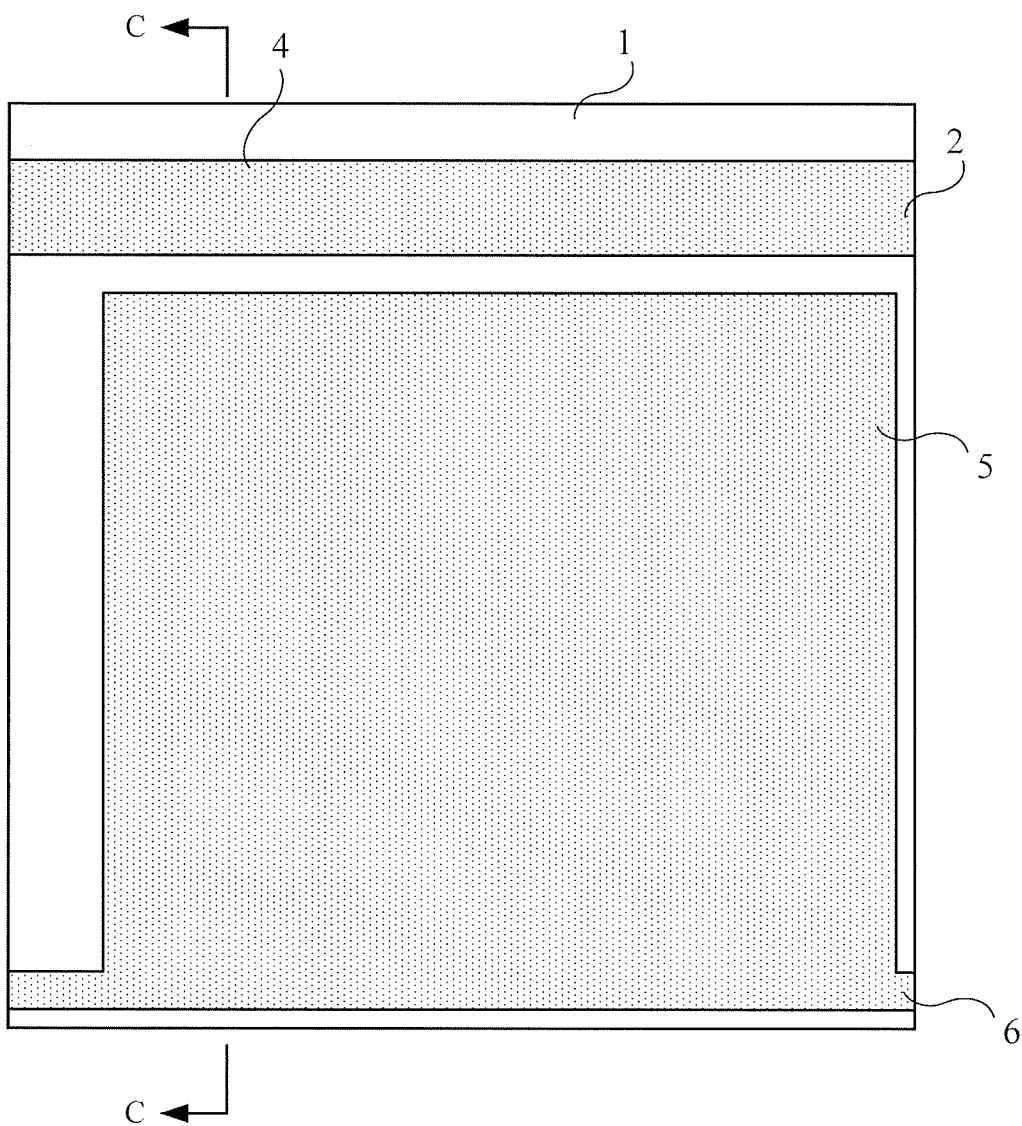
FIG. 6 is the second schematic top view showing the structure of part of the array substrate manufacture by the third embodiment of the invention.
Figure 7:
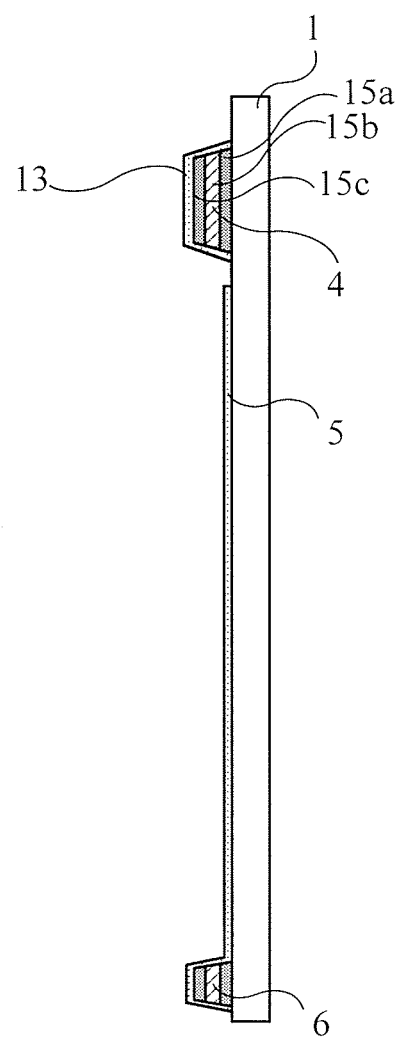
FIG. 7 is the side view of the section taken along C-C of FIG. 6.

Step 110 of depositing a gate metal film on a substrate 1 by the method of magnetron sputtering, wherein the material for the primary conductive layer 15b in the gate metal film can be copper or aluminum or the alloy thereof;

Step 120 of patterning the gate metal film to form the pattern of the gate scanning line 2, the gate electrode 4, and the gate electrode line 6 as the circuit pattern, as shown in FIG. 4 and FIG. 5;

Step 130 of depositing a common electrode film which is also used as a covering layer film on the substrate 1 with the above circuit pattern formed thereon;

Step 140 of patterning the common electrode film to form the pattern of the covering layer and the common electrode 5, wherein the covering layer covers the upper surface and the side surfaces of the gate scanning line 2, the gate electrode 4, and the common electrode line 6, as shown in FIG. 6 and FIG. 7.

The above steps 110-140 are the process of forming the gate scanning line 2, the gate electrode 4, the common electrode line 6, and the covering layer thereon. This covering layer can be referred to as the first covering layer 13, and it is formed with the patterning process and the material for forming the common electrode 5, without adding complexity to the process.

The following steps are for manufacturing the subsequent circuit patterns.

Figure 8:
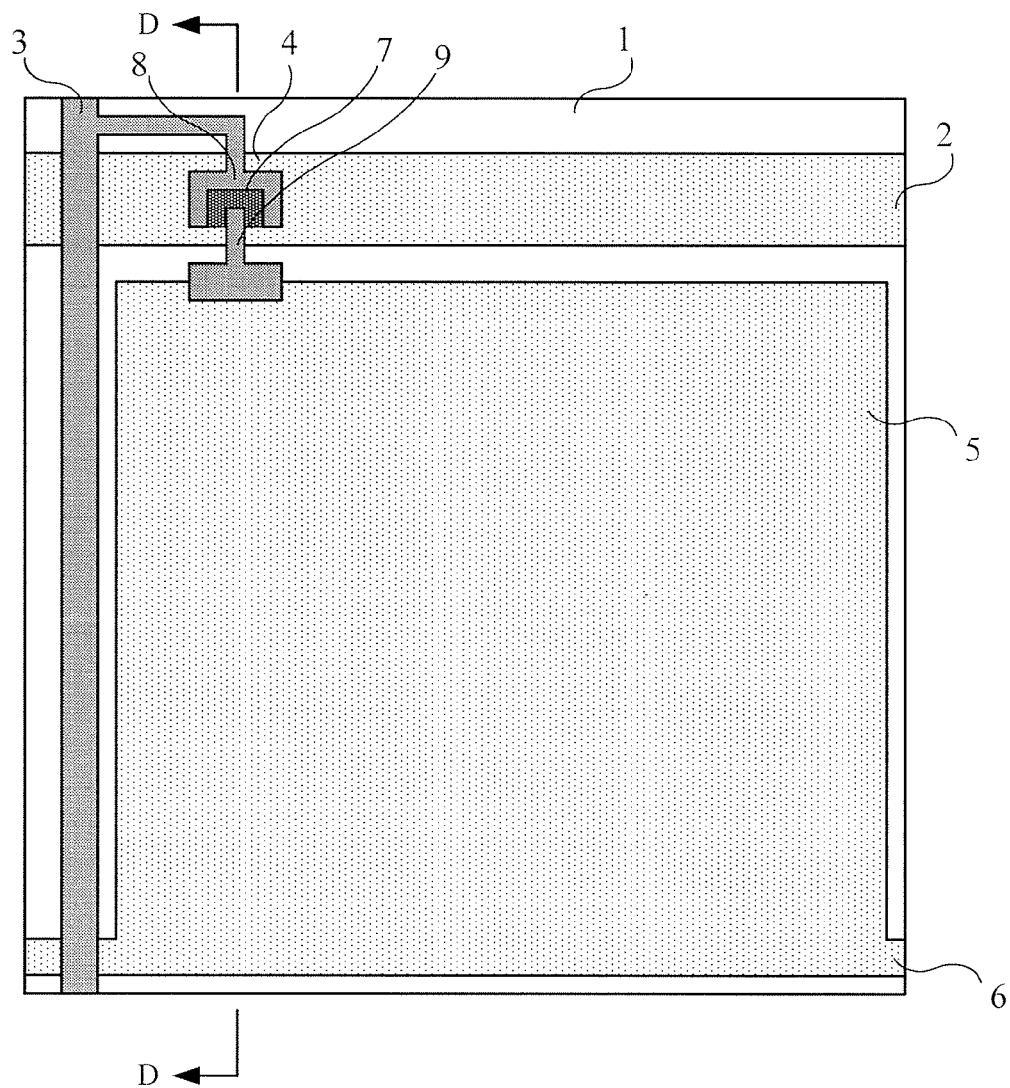
FIG. 8 is the third schematic top view showing the structure of part of the array substrate manufacture by the third embodiment of the invention.
Figure 9:
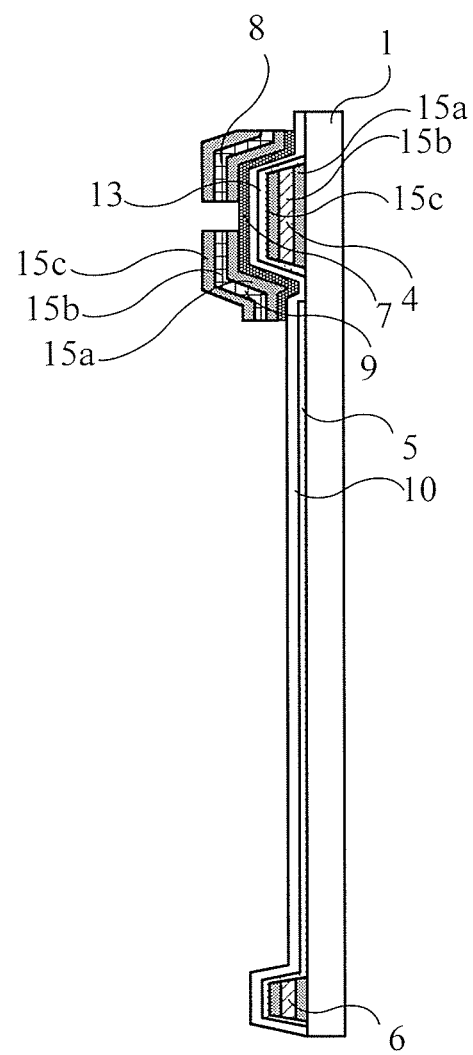
FIG. 9 is the side view of the section taken along D-D of FIG. 8.

Step 210 of forming the gate insulating layer 10 on the substrate 1 formed with the gate scanning line 2, the gate electrode 4, and the common electrode line 6;

Step 220 of depositing, successively, an active film and a data line metal film on the gate insulating layer 10;

Step 230 of patterning the active film and the data line metal film to form the patterns of the actively layer 7, the data line 3, the source electrode 8, and the drain electrode 9, as shown in FIG. 8 and FIG. 9;

Step 240 of depositing a pixel electrode film which is also used as a covering layer film on the substrate 1 with the above circuit pattern formed thereon;

Step 250 of patterning the pixel electrode film to form the pattern of the covering layer and the pixel electrode 12, wherein the covering layer covers the upper surface and the side surfaces of the data line 3, the source electrode 8, and the drain electrode 9, and the part of the covering layer corresponding to the TFT channel is etched away. Please refer to FIG. 1 and FIG. 2.

The above steps 210-250 are the process of forming the active layer 7, the data line 3, the source electrode 8, the drain electrode 9, and the upper covering layer thereon. This covering layer can be referred to as the second covering layer 14, and it is formed through the material and the patterning process for forming the pixel electrode 12 without adding complexity to the process.

In the embodiment, the steps 110-140 and the steps 210-250 can be carried out independently, and preferably carried out in the manufacturing process of the same one array substrate. Moreover, it is possible to form the circuit pattern with the lower barrier layer 15a and/or the upper barrier layer 15c as well as the primary conductive layer 15b merely through depositing different layer structures at the time of depositing the circuit pattern film.

To protect the active layer 7 between the source electrode 8 and the drain electrode 9, a protection film layer 11 can also be formed on the substrate 1 with the covering layer and the pixel electrode 12 formed thereon. The protection film layer 11 does not require the patterning process of forming via holes and can have a flat surface, which is helpful for the subsequent assembling process.

Lastly, the aforementioned embodiments are employed to describe, not to limit, the technique of the invention. Notwithstanding that a detailed description is given with references to the aforementioned preferred embodiments, as one of ordinary skill in the art understands, the technique embodied in the aforementioned embodiments can be modified, or some technical features can be substituted with the equivalents; such modifications or substitutions do not deviate the nature of the technique from the spirit and scope of the technique embodied in the embodiments according to the invention.

What is claimed is:

1. An array substrate, comprising:
a base substrate,
a circuit pattern provided on the base substrate;
a covering layer, covering and contacting an upper surface and side surfaces of the circuit pattern; and
a plurality of gate scanning lines and a plurality of date scanning lines, which define a plurality of pixel units on the base substrate, wherein a TFT switch, a pixel electrode and a common electrode are formed in each of the pixel units,
wherein the material of the covering layer is a transparent conductive material,
wherein the circuit pattern comprises the gate scanning lines and gate electrodes, and
wherein the covering layer and the common electrode are formed with a same material and in a same layer.

2. The array substrate according to claim 1, wherein the circuit pattern at least comprises a primary conductive layer.

3. The array substrate according to claim 2, wherein the circuit pattern further comprises a lower barrier layer provided under the lower surface of the primary conductive layer, and the lower barrier layer abuts the lower surface of the primary conductive layer.

4. The array substrate according to claim 2, wherein the circuit pattern further comprises an upper barrier layer provided on the upper surface of the primary conductive layer, and the upper barrier layer abuts the upper surface of the primary conductive layer and is covered by the covering layer.

5. The array substrate according to claim 3, wherein the circuit pattern further comprises an upper barrier layer provided on the upper surface of the primary conductive layer, and the upper barrier layer abuts the upper surface of the primary conductive layer and is covered by the covering layer.

6. The array substrate according to claim 2, wherein the material of the primary conductive layer is selected from the group consisting of copper, aluminum, copper alloy and aluminum alloy.

7. The array substrate according to claim 3, wherein the material of the lower barrier layer is selected from the group consisting of molybdenum, molybdenum-niobium alloy, molybdenum-titanium alloy, titanium, and titanium nitride.

8. The array substrate according to claim 4, wherein the material of the upper barrier layer is selected from the group consisting of molybdenum, molybdenum-niobium alloy, molybdenum-titanium alloy, titanium, and titanium nitride.

9. The array substrate according to claim 1, wherein the TFT switch in each pixel unit comprises a gate electrode, an active layer, a source electrode, and a drain electrode, and
the circuit pattern comprises the date lines and the source electrode and the drain electrode of the TFT switch in each pixel unit.

10. The array substrate according to claim 1, further comprising:
a second circuit pattern provided on the base substrate; and
a second covering layer, covering and contacting an upper surface and side surfaces of the second circuit pattern;
wherein the TFT switch in each pixel unit comprises a gate electrode, an active layer, a source electrode, and a drain electrode, and
the second circuit pattern comprises the date lines and the source electrode and the drain electrode of the TFT switch in each pixel unit.

11. The array substrate according to claim 10,
wherein the common electrode is in a block-shaped pattern that covers the pixel unit, and the pixel electrode is in a comb-shaped pattern with slits, and
wherein the second covering layer and the pixel electrode are formed with a same material and in a same step.

12. The array substrate according to claim 1, further comprising a common electrode line on the base substrate,
wherein the first covering layer covers and abuts the upper surface and the side surfaces of the common electrode line.

13. A method of manufacturing an array substrate, comprising:
depositing a circuit pattern film on a base substrate and patterning the circuit pattern film to form a circuit pattern; and
depositing a covering layer film and patterning the covering layer film to form a pattern of a covering layer, wherein the covering layer covers an upper surface and side surfaces of the circuit pattern,
wherein the material of the covering layer is a transparent conductive material,
wherein a pattern comprising a gate scanning line and a gate electrode is formed as the circuit pattern,
a common electrode film is deposited on the base substrate with the circuit pattern formed thereon, and the common electrode film is patterned to form the pattern of the covering layer and the common electrode, wherein the covering layer covers the upper surface and the side surfaces of the gate scanning line and the gate electrode.

14. The method of manufacturing an array substrate according to claim 13, wherein depositing the circuit pattern film on the base substrate comprises:
depositing, successively, a lower barrier layer film, a primary conductive layer film, and an upper barrier layer film on the base substrate as the circuit pattern film, or
depositing, successively, a primary conductive layer film and an upper layer film on the base substrate as the circuit pattern film, or
depositing, successively, a lower barrier layer film and a primary conductive layer film on the base substrate as the circuit pattern film, or
depositing a primary conductive layer film on the base substrate as the circuit pattern film.

15. The method of manufacturing an array substrate according to claim 13,
wherein a gate insulating layer is formed on the base substrate with a gate scanning line and a gate electrode formed thereon, and a pattern comprising an active layer, a data line, a source electrode, and a drain electrode is formed on the gate insulating layer as the circuit pattern, and
wherein a pixel electrode film is deposited on the base substrate with the circuit pattern formed thereon, and the pixel electrode film is patterned to form the pattern of the covering layer and the pixel electrode, and the covering layer covers the upper surface and the side surfaces of the data line, the source electrode, and the drain electrode.

16. The method of manufacturing an array substrate according to claim 15, further comprising after forming of the covering layer and pixel electrode:
forming a protection film layer on the base substrate with the covering layer and the pixel electrode formed thereon.

17. The array substrate according to claim 1, wherein the transparent conductive material is indium tin oxide or indium zinc oxide.

18. The method of manufacturing an array substrate according to claim 13, wherein the transparent conductive material is indium tin oxide or indium zinc oxide.

* * * * *